United States Patent [19]

Duncombe et al.

[11] Patent Number: 5,520,878

[45] Date of Patent: *May 28, 1996

[54] ALUMINUM NITRIDE BODY AND METHOD FOR FORMING SAID BODY UTILIZING A VITREOUS SINTERING ADDITIVE

[75] Inventors: Peter R. Duncombe, Peekskill; Subhash L. Shinde, Croton-on-Hudson; Takeshi Takamori, Mahopac, all of N.Y.

[73] Assignee: International Business Machines Corporation, Armonk, N.Y.

[*] Notice: The term of this patent shall not extend beyond the expiration date of Pat. No. 5,424,261

[21] Appl. No.: 438,315

[22] Filed: May 10, 1995

Related U.S. Application Data

[62] Division of Ser. No. 173,293, Dec. 22, 1993, Pat. No. 5,482,903.

[51] Int. Cl.$^6$ ........................................................ B22F 7/00
[52] U.S. Cl. ............................ 419/13; 419/5; 419/6; 419/10; 419/19; 419/32; 419/33; 419/36; 419/40
[58] Field of Search ............................. 419/5, 6, 10, 13, 419/19, 32, 33, 36, 40; 264/56, 57, 58, 61, 63

[56] References Cited

U.S. PATENT DOCUMENTS

| | | | |
|---|---|---|---|
| 5,292,477 | 3/1994 | Chance et al. | 419/9 |
| 5,296,189 | 3/1994 | Kang et al. | 419/9 |
| 5,424,261 | 6/1995 | Harris et al. | 501/96 |
| 5,429,790 | 7/1995 | Takahashi | 419/9 |

FOREIGN PATENT DOCUMENTS

| | | |
|---|---|---|
| 62-176961 | 1/1986 | Japan. |
| 3-218977 | 1/1990 | Japan. |
| 2-275769 | 4/1993 | Japan. |

OTHER PUBLICATIONS

Japan Kokai Tokkyo Koho JP 04,154,670, 27 May 1992, Appl. 90/276,803.

Physics and Chemistry of Glasses, vol. 2, No. 3, Jun. 1961, by A. E. Owen, "Properties of Glasses in the System $CaO-B_2O_3-Al_2O_3$, Part. 1. The d.c. conductivity and structure of calcium boroaluminate glasses".

*Primary Examiner*—Donald P. Walsh
*Assistant Examiner*—John N. Greaves
*Attorney, Agent, or Firm*—Ira David Blecker

[57] ABSTRACT

An unsintered aluminum nitride body including:

(a) 1 to 5 weight percent of a vitreous solid of boria, alumina, and calcia in the proportions of (1) boria between 3 and 25 weight percent, (2) alumina between 10 and 50 weight percent, and (3) calcia between 40 and 80 weight percent; and (b) aluminum nitride powder as the balance of the aluminum nitride body.

The invention further relates to a method of forming the unsintered aluminum nitride body and then sintering it at a temperature between 1550 and 1650 degrees Centigrade so as to form a dense, thermally conductive aluminum nitride body.

7 Claims, No Drawings

ALUMINUM NITRIDE BODY AND METHOD FOR FORMING SAID BODY UTILIZING A VITREOUS SINTERING ADDITIVE

This application is a divisional of Ser. No. 08/173,293 filed Dec. 22, 1993, and now U.S. Pat. No. 5,482,903.

BACKGROUND OF THE INVENTION

This invention relates to a method for the production of an aluminum nitride sintered body and, more particularly, relates to an unsintered aluminum nitride body and a method for forming such body followed by sintering so as to produce an aluminum nitride sintered body having a high density and satisfactory thermal conductivity by sintering at a temperature lower than that in conventional techniques.

Aluminum nitride has been of interest recently for electronic packaging applications because of its high thermal conductivity, thermal expansion matching with silicon, low dielectric constant (8.5) and high electrical resistivity.

Production of an aluminum nitride sintered body having excellent thermal conductivity requires forming of aluminum nitride powder followed by sintering to achieve a dense body.

Since aluminum nitride by itself is difficult to sinter under atmospheric pressure, pressureless sintering of aluminum nitride has conventionally been carried out with the aid of additive sintering aids.

For example, Takeshima et al. Japanese Kokai J04-154,670 discloses dense, sintered aluminum nitride bodies which have been achieved by the use of alumina and calcia additions.

Most of the additives proposed previously are highly refractory materials, and remain in the solid state during the early stage of sintering. During the course of sintering, some of them eventually form a liquid phase by reacting with any aluminum oxide present, either by intentional addition or with the aluminum oxide impurity in aluminum nitride. The liquid phase thus formed has been reported to aid densification of aluminum nitride. However, because of the refractory nature of these additives, the temperature required for sintering aluminum nitride has been exceptionally high (1800–2000 degrees Centigrade) compared to the sintering temperature of 1500–1600 degrees Centigrade for alumina.

Others have proposed lower melting additives such as boria in addition to calcia and alumina. Nakano et al. Japanese Kokai J02-275,769 discloses adding additions of aluminum, calcia and boria to aluminum nitride powder, followed by sintering at 1400–2000 degrees Centigrade. However, to achieve a fully dense body having a thermal conductivity of 192 W/m-K, the compositions were sintered at 1800 degrees Centigrade for 4 hours. Sawamura, et al., Japanese Kokai J62-176,961 discloses additions or mixtures of alumina, calcia and boria (as well as others) to aluminum nitride to achieve a sintered body. In one example, a mixture of 7 weight percent $3Al_2O_3 \cdot 5CaO$ and 1 weight percent $B_2O_3$ was added to aluminum nitride and sintered for 2 hours. The resulting thermal conductivity was 70 W/m-K. Boria, by itself, however, melts at about 450 degrees Centigrade which presents difficulties in electronic packaging applications. For example, it is necessary to remove substantially all residual carbon from substrates that are used in electronic applications. The low melting boria hinders this so-called binder burnoff process.

Finally, others have proposed the addition of sintering aids in the form of vitreous materials. Saito et al. Japanese Kokai J03-218,977 discloses the addition of 0.1–10 weight percent of a glass powder sintering aid to the aluminum nitride powder prior to sintering. The glass powder consists of 0–38 mole % alumina, 30–80 mole % boria and 20–56 mole % calcia. In weight percent, it is 0–28 weight % alumina, 27–77 weight % boria and 23–64 weight % calcia. The aluminum nitride body is sintered at a temperature greater than 1650 degrees Centigrade which is undesirably high. The resulting aluminum nitride samples have a maximum thermal conductivity of 110 W/m-K which, while better than alumina, is considerably less than pure aluminum nitride. Further, the majority of samples, however, had a thermal conductivity of 100 W/m-K or less.

Accordingly, the present inventors have proposed adding a calcia-alumina-boria glass to aluminum nitride powder in a way, and in an amount, sufficient to obtain a dense, highly thermally conductive body.

It is thus a purpose of the present invention to produce an aluminum nitride body that is dense and highly thermally conductive.

It is another purpose of the present invention to produce an aluminum nitride body by a sintering process at a lower sintering temperature than has heretofore been possible which will allow the production of the aluminum nitride body at a reduced cost.

These and other purposes of the present invention will become more apparent after referring to the following detailed description of the invention.

BRIEF SUMMARY OF THE INVENTION

The purposes of the invention have been achieved by providing, according to one aspect of the invention, an unsintered aluminum nitride body comprising:

(a) 1 to 5 weight percent of a vitreous solid powder of boria, alumina, and calcia in the proportions of (1) boria between 3 and 25 weight percent, (2) alumina between 10 and 50 weight percent, and (3) calcia between 40 and 80 weight percent; and (b) aluminum nitride powder as the balance of the aluminum nitride body.

According to a second aspect of the invention, there is provided a method of forming an aluminum nitride body comprising the steps of:

(a) preparing a mixture of boria, alumina, and calcia in the proportions of (1) boria between 3 and 25 weight percent, (2) alumina between 10 and 50 weight percent, and (3) calcia between 40 and 80 weight percent;

(b) melting the mixture to form a homogeneous liquid;

(c) quenching the liquid, thereby attaining a homogeneous vitreous solid;

(d) pulverizing the vitreous solid to obtain a predetermined particle size;

(e) adding the pulverized vitreous solid to aluminum nitride powder, in the proportions of (1) pulverized vitreous solid between 1 and 5 weight percent, and (2) aluminum nitride powder the balance; and (f) sintering the resulting mixture of pulverized vitreous solid and aluminum nitride powder at a temperature sufficient to cause densification of the mixture into a dense aluminum nitride body.

DETAILED DESCRIPTION OF THE INVENTION

This invention relates to the production of an aluminum nitride body having a high density and good thermal conductivity. More specifically, this invention relates to the production of an aluminum nitride body at a sintering temperature that is lower than is currently practiced. According to the invention, the aluminum nitride body may be produced by:

(a) preparing a mixture of boria, alumina, and calcia in the proportions of (1) boria between 3 and 25 weight percent, (2) alumina between 10 and 50 weight percent, and (3) calcia between 40 and 80 weight percent;

(b) melting the mixture to form a homogeneous liquid;

(c) quenching the liquid, thereby attaining a homogeneous vitreous solid;

(d) pulverizing the vitreous solid to obtain a predetermined particle size;

(e) adding the pulverized vitreous solid to aluminum nitride powder, in the proportions of (1) pulverized vitreous solid between 1 and 5 weight percent, and (2) aluminum nitride powder the balance; and (f) sintering the resulting mixture of pulverized vitreous solid and aluminum nitride powder at a temperature sufficient to cause densification of the mixture into a dense aluminum nitride body.

Aluminum nitride bodies produced according to this process are particularly suitable for co-fired multilayer electronic packages where a metallic paste is sintered along with the aluminum nitride body. The aluminum nitride bodies may be produced by slurry casting, hot pressing or some other method well known in the art. The forming process and the desired density and thermal conductivity will dictate the composition of the aluminum nitride body as will become apparent hereafter.

The process begins with a mixture of boria ($B_2O_3$), alumina ($Al_2O_3$) and calcia (CaO). The proportions of each of the components, in weight percent, are: 3–25% boria, 10–50% alumina and 40–80% calcia. This mixture is placed in a suitable crucible in a furnace and then heated to about 1450 degrees Centigrade to cause the components to melt homogeneously. Thereafter, the melt is rapidly quenched, such as by splat quenching between steel plates, or by roller quenching between cooled drums, so that the melt, once cooled to room temperature, forms a solid of clear vitreous character.

Upon quenching, the vitreous solid will be in the form of glass ribbons which are unsuitable for the present invention. The vitreous solid must then be pulverized or comminuted so as to obtain the desired particle size. A preferred particle size for the present invention is about 3 to 5 microns. The particles of the vitreous solid are then dried by conventional means and stored for the next step of the process.

Now, the aluminum nitride body may be formed. An amount of 1 to 5 weight percent of the pulverized vitreous solid is added to aluminum nitride powder. The aluminum nitride powder should have a particle size of about 1–1.5 microns. Aluminum nitride powder is available from a number of sources such as Tokuyama Soda (grades F and H) and Dow Chemical (grades 44 and 48). For the most preferred embodiment of the invention, the present inventors prefer the Tokuyama Soda, grade F, aluminum nitride powder because of its low oxygen content and more uniform particle distribution which, the inventors have found, leads to greater densification and higher thermal conductivity. To this mixture may be added a binder material which can assist in holding the body together in the green state prior to sintering. Suitable binders are ethyl cellulose, polyvinyl butyral and polymethyl methacrylate (PMMA), all of which are conventional and well known. The amount of binder material will depend on the actual forming operation that is utilized to form the aluminum nitride body.

If, for example, the aluminum nitride body is to be formed by hot pressing, only about 5 weight percent binder material need be added to the mixture of aluminum nitride and pulverized vitreous solid.

A slurry casting process can also be used with this invention but it is a more complicated process. For slurry casting, a mixture is made consisting of ceramic materials (aluminum nitride powder plus the pulverized vitreous solid), binder, solvent and minor conventional constituents such as plasticizers and anti-oxidants. The binder may be about 5 to 15 weight percent while the solvent amounts to about 20 to 45 weight percent, the remainder being the ceramic materials. The slurry is cast onto a carrier sheet, usually of a polymeric material which conventionally may be Mylar. Upon drying, the carrier sheet is removed and a tape of the product is produced. The tape is blanked into the desired endshape. One desired endshape is a greensheet for fabricating multilayer ceramic packages.

Multilayer ceramic packages may be fabricated by the following process. A series of greensheets are punched to form "vias" and then a metallic paste is screened onto the greensheets, to form conductive lines, and into the vias to form conductive pathways between the different layers of greensheets. For aluminum nitride products, the preferred metallic pastes contain molybdenum, tungsten, or mixtures of molybdenum and tungsten. The greensheets are then stacked, laminated and sintered to obtain a multilayer ceramic package. In use, at least one semiconductor device is mounted on the multilayer ceramic package. The multilayer ceramic package is a preferred use of the present invention.

The aluminum nitride body may be sintered in a conventional furnace so long as there is a protective atmosphere. A preferred atmosphere is forming gas which is a mixture of nitrogen and hydrogen gases. A typical sintering schedule can be undertaken as follows. The unsintered aluminum nitride bodies are inserted into a sintering furnace. A protective atmosphere of dry forming gas ($N_2$+10–20% $H_2$) is used throughout the sintering process. Over a period of about 5 hours, the temperature is ramped up from room temperature to about 600 degrees Centigrade to pyrolyze the binder. Then, over a period of about 8 hours, the temperature is ramped up to the sintering temperature of about 1550–1650 degrees Centigrade and held at the sintering temperature for about 5 hours. Then, over a period of about 5 hours, the temperature is ramped down to room temperature.

As noted above, the proportions of the components of the vitreous solid, in weight percent, are 3–25% boria, 10–50% alumina and 40–80% calcia. It has been found, however, that excessive amounts of calcia and boria can cause gelling of the casting slurry making it, for all intents and purposes, uncastable. Therefore, for slurry casting, it is preferred that the proportions of the components of the vitreous solid, in weight percent, are 5–20% boria, 20–45% alumina and 45–65% calcia. For greatest density and thermal conductivity, it is most preferred that the proportions of the components of the vitreous solid, in weight percent, are 5–15% boria, 30–40% alumina and 45–55% calcia.

Generally speaking, if there is too much boria, the glass is too reactive with the ambient while if there is too little boria (e.g. below about 3 weight percent), there is little advantageous effect. Above about 20 weight percent boria, there is undesirable gelling of the casting slurry. With respect to alumina, too much alumina reduces thermal conductivity while if alumina is reduced too much, the glass becomes chemically less durable and therefore it is not practical. Calcia also needs to be limited since inordinately high amounts cause gelling of the casting slurry.

There are three important features of the present invention. The first is that the sintering aid is introduced as a vitreous additive rather than as separate components which form a liquid phase in-situ. In this way, more uniform sintering is obtained in that there is a definite temperature at which the vitreous additive will become liquid. For the present boria-alumina-calcia system, viscous flow begins at around 800 degrees Centigrade with the vitreous additive actually becoming liquid at around 1270 degrees Centigrade. The sintering temperature is between 1550 and 1650 degrees Centigrade. The formation of the liquid phase in the system at such an early stage of sintering helps densification of aluminum nitride bodies. In the ternary boria-alumina-calcia system, the glass forming range, where one can obtain more thermally stable glasses, has been known for the composition with more than 30 weight % of boria as reported by Owen (A. E. Owen, Phys. Chem. Glasses, 2[3] pp. 87–98, 1961). However, it has been found in the present invention that (1) one can form vitreous solid for the composition far outside of the reported glass forming range, with much less boria incorporation, by rapid quenching; (2) viscous flow of such less boria glasses occurs at 800 degrees Centigrade or higher which is higher then the temperature range where pyrolysis of most binders occurs; (3) such less boria glasses crystallize at about 900 degrees Centigrade to limit the viscous flow so that the calcined body remains porous for ease of any additional reaction for binder residues; (4) crystallized phases of such less boria glasses melt at about 1250 degrees Centigrade which is 100 degrees Centigrade lower then the eutectic temperature of calcia-alumina system without boria.

The second important feature is the use of a fugitive constituent. The fugitive constituent, boria, lowers the liquidus of the second phase to enhance densification, but will eventually leave the system by evaporation, thereby reducing the volume fraction of the second phase after sintering, and thus minimizing possible degradation of the thermal conductivity of the sintered aluminum nitride body by the sintering aid. To control the evaporation of the fugitive constituent, it is necessary to encapsulate the aluminum nitride body, such as with molybdenum baffles. It is believed that aluminum nitride, boron nitride or graphite baffles would work as well. Such encapsulation should not be too tight but, without adequate encapsulation, any non-uniformity in the boria content in the sintering aluminum nitride bodies will cause serious warping and non-uniform densification.

The last important feature of the present invention is that the carbon residue resulting from pyrolysis of the binder material may advantageously be used to effect in-situ carbothermal reduction and nitridation of oxides. The residual carbon cannot be burned off due to the non-oxidizing atmosphere; however, the residual carbon is utilized for carbothermal reduction and nitridation, which are the same processes used to produce aluminum nitride, to minimize the oxygen content in the sintered aluminum nitride body. In practice, a forming gas atmosphere (e.g., $N_2+20\%\ H_2$) is used. Such a reducing atmosphere would be favored for carbothermal nitridation, seen from the following chemical reactions:

$$Al_2O_3+N_2+3C=2AlN+3CO\uparrow$$

$$3CaO+N_2+3C=Ca_3N_2\uparrow+3CO\uparrow$$

The first reaction is well known while the second one, while feasible, is not well established. The end result, however, is reduction of the oxides present, thereby increasing the thermal conductivity.

The advantages of the present invention will become more apparent after referring to the following examples.

EXAMPLES

A number of samples were fabricated in the following manner. Several different glass compositions were made wherein the relative proportions of calcia, boria and alumina were varied. The glass particles were pulverized by ball milling with methanol (zirconia media and alumina jar) for 14–15 hours and then poured into a shallow tray for drying. The crushed vitreous particles were then added to aluminum nitride particles and 10% of polyvinyl butyryl binder solution and ballmilled in an alumina jar (nylon or alumina media) for 14 hours to prepare a uniform slurry. The aluminum nitride powder was either Dow Chemical, grade 44 or 48, or Tokuyama Soda, grade F. The ballmilled slurry was tape cast by the doctor-blade method to form 6 mils thick tape. The tape was then blanked to square sheets, 20 of which were stacked, laminated and sintered at 1580 degrees Centigrade for 10 hours (except for one sample (**) which was sintered for 24 hours) and then cooled to room temperature. The results are tabulated in Table I below. The percent densification was determined by the size of the sintered sample against the theoretical value and the thermal conductivity was determined by the laser flash method.

TABLE I

| $CaO/Al_2O_3/$ $B_2O_3$ Ratio | AlN[+] Type | % Glass | % Densification | Thermal Conductivity (W/m-K) |
|---|---|---|---|---|
| 70/20/10 | D48 | 3.5 | Gelled | |
| 60/30/10 | D48 | 3.5 | Gelled | |
| 50/40/10 | T-F | 3.1 | 97.5 | 148** |
| | D44 | 4.5 | 94.3 | 101.5 |
| | D44 | 3.5 | 95.4 | 100.7 |
| | D48 | 3.5 | 94.3 | — |
| | T-F | 3.5 | 95.9 | 110.4 |
| | T-F | 5.0 | 97.2 | |
| 50/30/20 | D48 | 2.0 | 85.1 | |
| | T-F | 3.0 | 95.6 | 123.8 |
| | T-F | 5.0 | 94.5 | 120.0 |

[+]For type of AlN used, D48 is DowChemical grade 48, D44 is DowChemical grade 44, T-F is Tokuyama Soda grade F.
**Sintered for 24 hours.

As can be seen from Table I, the samples with 60 and 70 weight percent calcia gelled. Since the inventors were most interested in castable slurries, these samples were not further investigated. If the best samples are taken (i.e., those made with Tokuyana soda, Grade F powder), a thermal conductivity of 110–120 W/m-K can be obtained for dense aluminum nitride bodies at a relatively low sintering temperature of 1580 degrees Centigrade. The thermal conductivity can be further enhanced to 148 W/m-K by extending the sintering time to 24 hours. Thus, the advantages of the present invention are apparent, namely, dense aluminum nitride bodies with a satisfactory thermal conductivity as a result of pressureless sintering at a relatively low temperature. With optimization of the aluminum nitride powder and sintering time, it is expected that the thermal conductivity could be increased even further.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming an aluminum nitride body comprising the steps of:
    (a) preparing a mixture of boria, alumina, and calcia in the proportions of (1) boria between 3 and 25 weight percent, (2) alumina between 10 and 50 weight percent, and (3) calcia between 40 and 80 weight percent;
    (b) melting the mixture to form a homogeneous liquid;
    (c) quenching the liquid, thereby attaining a homogeneous vitreous solid;
    (d) pulverizing the vitreous solid to obtain a predetermined particle size;
    (e) adding the pulverized vitreous solid to aluminum nitride powder, in the proportions of (1) pulverized vitreous solid between 1 and 5 weight percent, and (2) aluminum nitride powder the balance; and
    (f) sintering the resulting mixture of pulverized vitreous solid and aluminum nitride powder at a temperature sufficient to cause densification of the mixture into a dense aluminum nitride body.

2. The method of claim 1 wherein the sintering temperature is in the range of 1550 to 1650 degrees Centigrade.

3. The method of claim 1 further comprising the step between steps (e) and (f) of combining a binder material with the pulverized vitreous solid and aluminum nitride powder to form a slurry and casting the slurry into greensheets.

4. The method of claim 1 wherein, in step (a), the amount of boria present is between 5 and 20 weight percent, the amount of alumina present is between 20 and 45 weight percent, and the amount of calcia present is between 45 and 65 weight percent.

5. The method of claim 4 wherein the amount of boria present is between 5 and 15 weight percent, the amount of alumina present is between 30 and 40 weight percent, and the amount of calcia present is between 45 and 55 weight percent.

6. The method of claim 3 wherein there are a plurality of greensheets and further comprising the step of depositing a metallic composition on at least one of the greensheets.

7. The method of claim 6 wherein the metallic composition comprises molybdenum, tungsten or mixtures thereof.

* * * * *